United States Patent
Park et al.

(10) Patent No.: US 8,604,644 B2
(45) Date of Patent: *Dec. 10, 2013

(54) LOAD IMPEDANCE DECISION DEVICE, WIRELESS POWER TRANSMISSION DEVICE, AND WIRELESS POWER TRANSMISSION METHOD

(71) Applicants: Eun Seok Park, Yeongtong-gu (KR); Sang Wook Kwon, Seongnam-si (KR); Young-tack Hong, Seongnam-si (KR)

(72) Inventors: Eun Seok Park, Yeongtong-gu (KR); Sang Wook Kwon, Seongnam-si (KR); Young-tack Hong, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/677,561

(22) Filed: Nov. 15, 2012

(65) Prior Publication Data
US 2013/0069735 A1    Mar. 21, 2013

Related U.S. Application Data
(63) Continuation of application No. 12/939,762, filed on Nov. 4, 2010, now Pat. No. 8,334,620.

(30) Foreign Application Priority Data
Nov. 9, 2009  (KR) .................. 10-2009-0107508

(51) Int. Cl.
*H01F 38/14*    (2006.01)
*H01F 37/00*    (2006.01)

(52) U.S. Cl.
USPC ............................ 307/104; 320/108; 331/74

(58) Field of Classification Search
USPC .............. 331/74; 307/104; 320/108; 324/635
See application file for complete search history.

(56) References Cited

U.S. PATENT DOCUMENTS

| | | |
|---|---|---|
| 2,630,475 A | 3/1953 | Woodward, Jr. |
| 2001/0030581 A1 | 10/2001 | Dent |
| 2001/0042406 A1 | 11/2001 | Pchelnikov et al. |
| 2007/0018792 A1 | 1/2007 | Taki et al. |
| 2009/0045772 A1 | 2/2009 | Cook et al. |
| 2009/0058189 A1 | 3/2009 | Cook et al. |
| 2009/0134712 A1 | 5/2009 | Cook et al. |
| 2009/0153273 A1 | 6/2009 | Chen et al. |
| 2009/0284083 A1 | 11/2009 | Karalis et al. |

FOREIGN PATENT DOCUMENTS

| | | |
|---|---|---|
| JP | 2006-005978 | 1/2006 |
| JP | 2008-154222 | 7/2008 |
| JP | 2008-263710 | 10/2008 |
| JP | 2008-283804 | 11/2008 |
| KR | 10-2009-0011509 | 2/2009 |
| WO | WO 2007/146164 | 12/2007 |

OTHER PUBLICATIONS
International Search Report and Written Opinion of the International Searching Authority issued on Jul. 29, 2011, in counterpart International Application No. PCT/KR2010/007860 (8 pages, in English).

*Primary Examiner* — Joseph Chang
(74) *Attorney, Agent, or Firm* — NSIP Law

(57) ABSTRACT

A load impedance decision device, a wireless power transmission device, and a wireless power transmission method are provided. At least one of a distance and an angle between two resonators may be measured. A load impedance may be determined based on at least one of the measured distance and the measured angle. When the distance between the two resonators changes, a high power transfer efficiency may be maintained without using a separate matching circuit. Where the load impedance is determined, a test power may be transmitted. Depending on a power transfer efficiency of the test power, the load impedance may be controlled and power may be wirelessly transmitted from the source resonator to the target resonator.

22 Claims, 7 Drawing Sheets

LOAD IMPEDANCE DECISION DEVICE, WIRELESS POWER TRANSMISSION DEVICE, AND WIRELESS POWER TRANSMISSION METHOD

CROSS-REFERENCE TO RELATED APPLICATION(S)

This application is a continuation application of U.S. patent application Ser. No. 12/939,762, filed Nov. 4, 2010, which claims the benefit under 35 U.S.C. §119(a) of Korean Patent Application No. 10-2009-0107508, filed on Nov. 9, 2009, in the Korean Intellectual Property Office, the entire disclosure of each of which is incorporated herein by reference for all purposes.

BACKGROUND

1. Field

The following description relates to a load impedance decision device, a wireless power transmission device, and a wireless power transmission method, and more particularly, to a wireless transmission technology that efficiently manages wireless power transmission from a source resonator to a target resonator even if the distance between the source resonator and the target resonator changes.

2. Description of Related Art

With the development of information technology (IT), an increasing amount of portable electronic devices are being distributed. Due to various characteristics of the portable electronic products, a battery performance of a corresponding portable electronic product becomes an important issue. Various portable electronic products and home electronic appliances have the ability to transmit data wirelessly, however, the portable electronic products typically receive power using a wired connection such as plugging the device into an outlet.

Currently, researches are conducted on a wireless power transmission technology that may wirelessly supply power. Due to characteristics of wireless environments, a distance between a source resonator and a target resonator may vary over time and a matching condition between the source resonator and the target resonator may also vary. Accordingly, disclosed is a new scheme that may enhance the efficiency of a wireless transmission even in environments where the source resonator and/or target resonator dynamically change location.

SUMMARY

In one general aspect, there is provided a load impedance decision device comprising a measurement unit to measure at least one of a distance and an angle between a source resonator and a target resonator, and a decision unit to determine the load impedance based on at least one of the measured distance and the measured angle.

The decision unit may determine the load impedance based on both the measured distance and the measured angle.

The load impedance decision unit may be included in the source resonator, and the measured angle may correspond to an angle with which the source resonator is tilted with respect to the target resonator.

In another aspect, there is provided a wireless power transmission device comprising a load impedance decision unit, and a change unit to change an impedance of the wireless power transmission device to be conjugated with a load impedance determined by the load impedance decision unit, wherein the load impedance decision unit comprises a measurement unit to measure at least one of a distance and an angle between the wireless power transmission device and a target resonator, and a decision unit to determine the load impedance based on at least one of the measured distance and the measured angle.

The wireless power transmission device may further comprise a transmitter to transmit, to a terminal, information associated with the load impedance determined by the load impedance decision unit.

The change unit may change the impedance of the wireless power transmission device based on at least one of a tunable resistance, an inductor, and a capacitor.

The wireless power transmission device may further comprise a testing unit to transmit a test power using the changed impedance, and a control unit to control the load impedance decision unit to re-determine the load impedance when a power transfer efficiency of the test power is less than a reference value, and to control the wireless power transmission device to wirelessly transmit a power using the changed impedance when the power transfer efficiency of the test power is greater than or equal to the reference value.

The decision unit may determine the load impedance based on both the measured distance and the measured angle.

The wireless power transmission device may include a source resonator, and the measured angle may correspond to an angle with which the source resonator is tilted with respect to the target resonator.

In another aspect, there is provided a terminal to wirelessly receive power, comprising a load impedance decision unit, and a change unit to change an impedance of the terminal to match a load impedance determined by the load impedance decision unit, wherein the load impedance decision unit comprises a measurement unit to measure at least one of a distance and an angle between the terminal and a target resonator, and a decision unit to determine the load impedance based on at least one of the measured distance and the measured angle.

The terminal may further comprise a transmitter to transmit, to a wireless power transmission device, information associated with the load impedance determined by the load impedance decision unit.

The change unit may change the impedance of the terminal based on at least one of a tunable resistance, an inductor, and a capacitor.

The terminal may further comprise a signal transmitter to transmit a test power request signal to a wireless power transmission device when the change unit changes the impedance of the terminal, and a control unit to control the load impedance decision unit to re-determine the load impedance when a power transfer efficiency of the test power is less than a reference value, and to transmit a signal to the wireless power transmission device to wirelessly transmit power when the power transfer efficiency of the test power is greater than or equal to the reference value.

The decision unit may determine the load impedance based on both the measured distance and the measured angle.

The terminal may include a source resonator, and the measured angle may correspond to an angle with which the source resonator is tilted with respect to the target resonator.

In another aspect, there is provided a method to determine a load impedance, comprising measuring at least one of a distance and an angle between a source resonator and a target resonator, and determining the load impedance based on at least one of the measured distance and the measured angle.

The load impedance may be determined based on both the measured distance and the measured angle.

The measured angle may correspond to an angle with which the source resonator is tilted with respect to the target resonator.

In another aspect, there is provided a method to wirelessly transmit a power, comprising determining a load impedance, and changing an impedance to be conjugated with the determined load impedance, wherein the determining comprises measuring at least one of a distance and an angle between a source resonator and a target resonator, and determining the load impedance based on at least one of the measured distance and the measured angle.

Other features and aspects may be apparent from the following description, the drawings, and the claims.

BRIEF DESCRIPTION OF THE DRAWINGS

Throughout the drawings and the description, unless otherwise described, the same drawing reference numerals should be understood to refer to the same elements, features, and structures. The relative size and depiction of these elements may be exaggerated for clarity, illustration, and convenience.

DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein may be suggested to those of ordinary skill in the art. Also, description of well-known functions and constructions may be omitted for increased clarity and conciseness.

Figure 1:
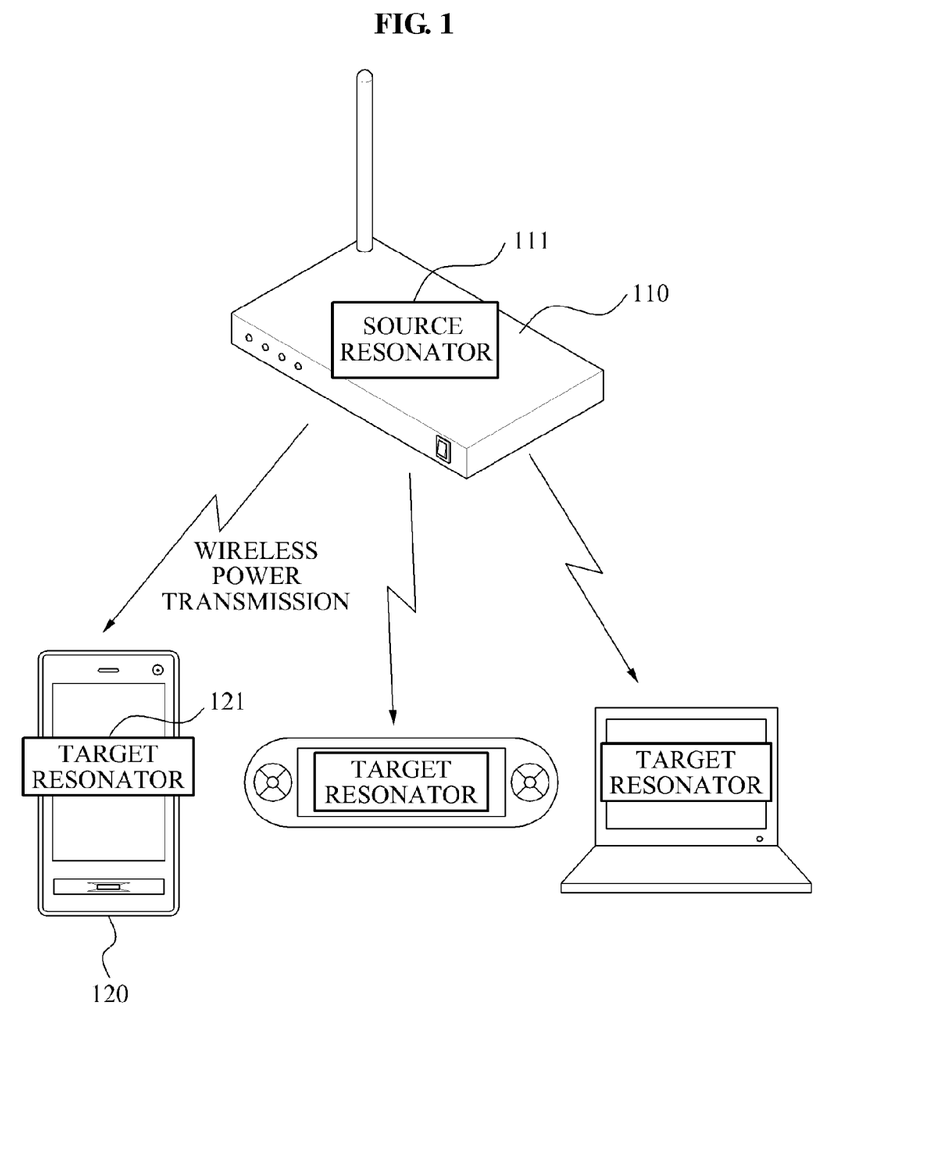
FIG. 1 is a diagram illustrating an example of a wireless power transmission device that transmits power wirelessly to a terminal.

FIG. 1 illustrates an example of a wireless power transmission device that transmits power wirelessly to a terminal.

Referring to FIG. 1, wireless power transmission device 110 wirelessly transmits power to terminal 120. In this example, the wireless power transmission device 110 includes a source resonator 111, and the terminal 120 includes a target resonator 121. As an example, the wireless power transmission device 110 may be included in a portable device.

Figure 2:
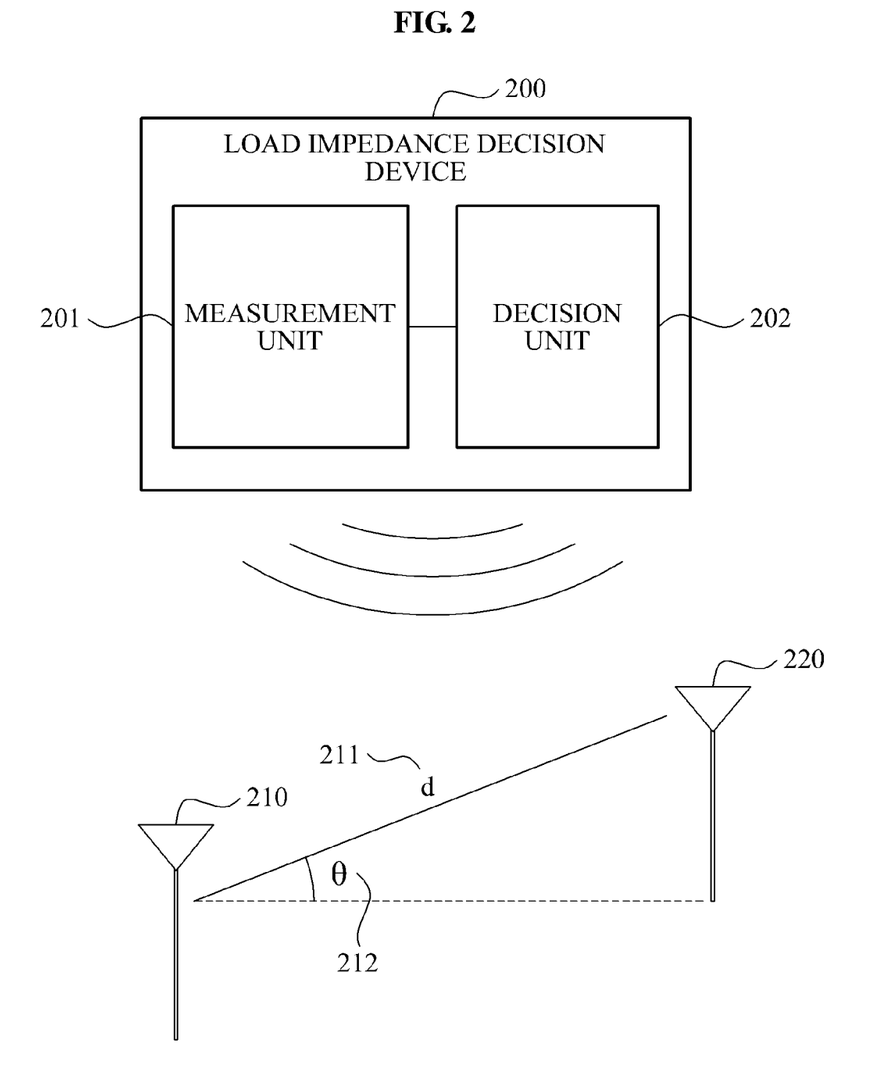
FIG. 2 is a diagram illustrating an example of a load impedance decision device.

FIG. 2 illustrates an example of a load impedance decision device.

Referring to FIG. 2, load impedance decision device 200 includes a measurement unit 201 and a decision unit 202. The measurement unit 201 may measure at least one of a distance d 211 and an angle θ212 between a source resonator 210 and a target resonator 220. For example, the measurement unit 201 may include a distance sensor (not shown) that uses light waves and/or ultrasonic waves. The measurement unit 201 may measure the distance d 211 using the distance sensor. The measured angle θ212 may indicate an angle at which the target resonator 220 is tilted with respect to the source resonator 210.

The decision unit 202 may determine a load impedance based on at least one of the measured distance d 211 and angle θ212. For example, the decision unit 202 may determine the load impedance based on the measured distance d 211. The decision unit may determine the load impedance based on the angle θ212. As another example, the decision unit 202 may determine the load impedance based on both the measured distance d 211 and the angle θ212. The decision unit 202 may determine the load impedance such that a maximum power may be transmitted from a wireless power transmission device (not shown) to a terminal (not shown). A scheme for determining the load impedance is described with reference to FIG. 3.

Figure 3:
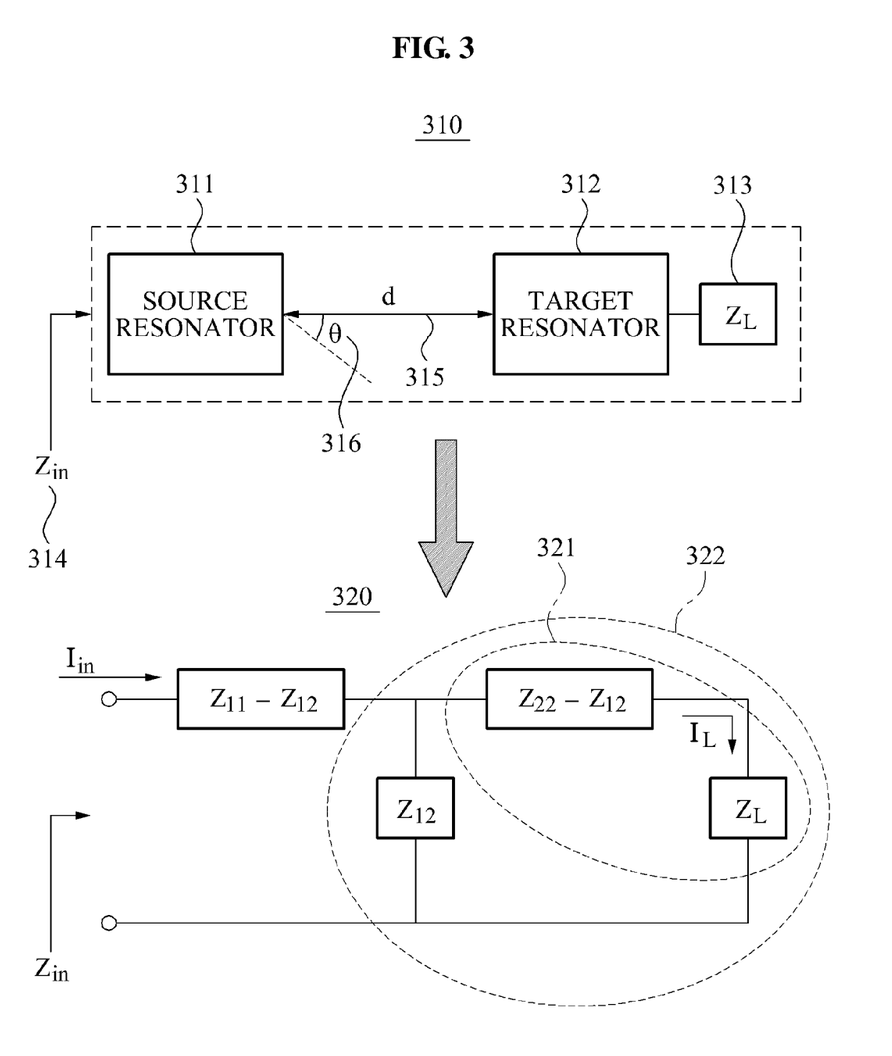
FIG. 3 is a diagram illustrating an example of a Z-matrix of a load impedance, a source resonator, and a target resonator.

FIG. 3 illustrates an example of a Z-matrix of a load impedance $Z_L$, a source resonator, and a target resonator.

Referring to FIG. 3, a configuration 310 of source resonator 311, target resonator 312, and load impedance $Z_L$ 313 is illustrated. The source resonator 311 and the target resonator 312 are separated from each other by a distance d 315 and an angle θ316. The target resonator 312 is connected to the load impedance $Z_L$ 313.

$Z_{in}$ 314 denotes an input impedance viewed from a wireless power transmission device (not shown) that supplies power.

FIG. 3 also illustrates Z matrix 320 with respect to the configuration 310. $Z_{11}$ corresponds to an impedance of the source resonator 311, $Z_{12}$ corresponds to an impedance between the source resonator 311 and the target resonator 312, and $Z_{22}$ corresponds to an impedance of the target resonator 312, A scheme for determining the load impedance such that a maximum power may be transmitted from the wireless power transmission device to the terminal is described herein.

The input impedance $Z_{in}$ 314 may be determined using the following Equation to 1:

$$Z_k = Z_{22} - Z_{12} + Z_L \qquad (1)$$

$$Z_n = Z_{12} // Z_k \rightarrow \frac{1}{Z_n} =$$

$$\frac{1}{Z_{12}} + \frac{1}{Z_k} = \frac{1}{Z_{12}} + \frac{1}{Z_{22} - Z_{12} + Z_L} = \frac{Z_{22} + Z_L}{Z_{12}(Z_{22} - Z_{12} + Z_L)}$$

$$\therefore Z_n = Z_{12} - \frac{Z_{12}^2}{Z_{22} + Z_L}$$

$$Z_{in} = Z_{11} - Z_{12} + Z_n = Z_{11} - \frac{Z_{12}^2}{Z_{22} + Z_L}.$$

In this example, $Z_k$ corresponds to a sum of impedances included in a dotted circle 321, and $Z_{in}$ corresponds to a sum of impedances included in a dotted circle 322.

An input power $P_{in}$ supplied by the wireless power transmission device may be expressed by the following Equation 2:

$$P_{in} = \frac{1}{2}\text{Re}[Z_{in}] \cdot |I_{in}|^2. \qquad (2)$$

In this example, $I_{in}$ corresponds to a current flowing from the wireless power transmission device that supplies power in the Z matrix.

Power $P_L$ transferred to a load from among the input power $P_{in}$ supplied by the wireless power transmission device, may be expressed by the following Equation 3:

$$P_L = \frac{1}{2}\text{Re}[Z_L] \cdot |I_L|^2 \qquad (3)$$

$$= \frac{1}{2}\text{Re}[Z_L] \cdot \left|\frac{Z_{12}I_{in}}{Z_k + Z_{12}}\right|^2$$

$$= \frac{1}{2}\text{Re}[Z_L] \cdot \left|\frac{Z_{12}I_{in}}{Z_{22} + Z_L}\right|^2.$$

Based on Equation 2 and Equation 3, a power transfer efficiency PTE may be expressed by the following Equation 4:

$$PTE = \frac{P_L}{P_{in}} = \frac{\text{Re}[Z_L]}{\text{Re}[Z_{in}]} \cdot \left|\frac{Z_{12}}{Z_{22} + Z_L}\right|^2. \qquad (4)$$

The load impedance $Z_L$ to transmit the maximum power may be determined using the following Equation 5:

$$\begin{cases} \dfrac{\partial PTE}{\partial \text{Re}[Z_L]} = 0 \\ \dfrac{\partial PTE}{\partial \text{Im}[Z_L]} = 0. \end{cases} \qquad (5)$$

A load impedance $Z_L$ that satisfies the above Equation 5 may be expressed as an optimum load impedance $Z_L^{opt}$. A power transfer efficiency $PTE_{max}$ at which the optimum load impedance $Z_L^{opt}$ and the maximum power may be transmitted may be expressed by the following Equation 6:

$$\text{Re}[Z_L^{opt}] = \text{Re}[Z_{22}]\sqrt{1 - \text{Re}[X^2] - \frac{1}{4}\text{Im}[X^2]^2} \qquad (6)$$

$$\text{Im}[Z_L^{opt}] = \frac{1}{2}\text{Re}[Z_{22}] \cdot \text{Im}[X^2] - \text{Im}[Z_{22}]$$

$$PTE^{max} = \frac{|X|^2}{2 - \text{Re}[X^2] + \sqrt{4(1 - \text{Re}[X^2]) - \text{Im}[X^2]^2}}.$$

In the above Equation 6, X may correspond to the following Equation 7:

$$X = \frac{Z_{12}}{\text{Re}[Z_{22}]} = \frac{R_{a1}^{rad}|T|\sqrt{\frac{\text{Re}[Z_{22}]}{\text{Re}[Z_{11}]}}}{\text{Re}[Z_{22}]} = \qquad (7)$$

$$R_{a1}^{rad}|T|\frac{1}{\sqrt{\text{Re}[Z_{11}] \cdot \text{Re}[Z_{22}]}} = \frac{R_{a1}^{rad}|T|}{\text{Re}[Z_{11}]}\sqrt{\frac{\text{Re}[Z_{11}]}{\text{Re}[Z_{22}]}}$$

$$\therefore X = \eta_{eff\_1}T\sqrt{\frac{\text{Re}[Z_{11}]}{\text{Re}[Z_{22}]}} \Leftarrow \left(\because \eta_{eff\_1} = \frac{R_{a1}^{rad}}{\text{Re}[Z_{11}]}\right)$$

$$T = \frac{3}{2}\left\{-\sin^2\theta\frac{1}{jkd} + (3\cos^2\theta - 1)\left[\frac{1}{(jkd)^2} + \frac{1}{(jkd)^3}\right]\right\}e^{-jkd}.$$

In this example, d corresponds to the distance d 315 between the source resonator 311 and the target resonator 312, and θ corresponds to the angle θ316 between the source resonator 311 and the target resonator 312.

As an example, a measurement unit of the load impedance decision unit may measure the distance d 315 and the angle θ316 between the source resonator 311 and the target resonator 312, and the decision unit may determine a load impedance based on at least one of the measured distance d 315 and the angle θ316 such that the maximum power may be transmitted as shown in the above Equation 6.

Figure 4:
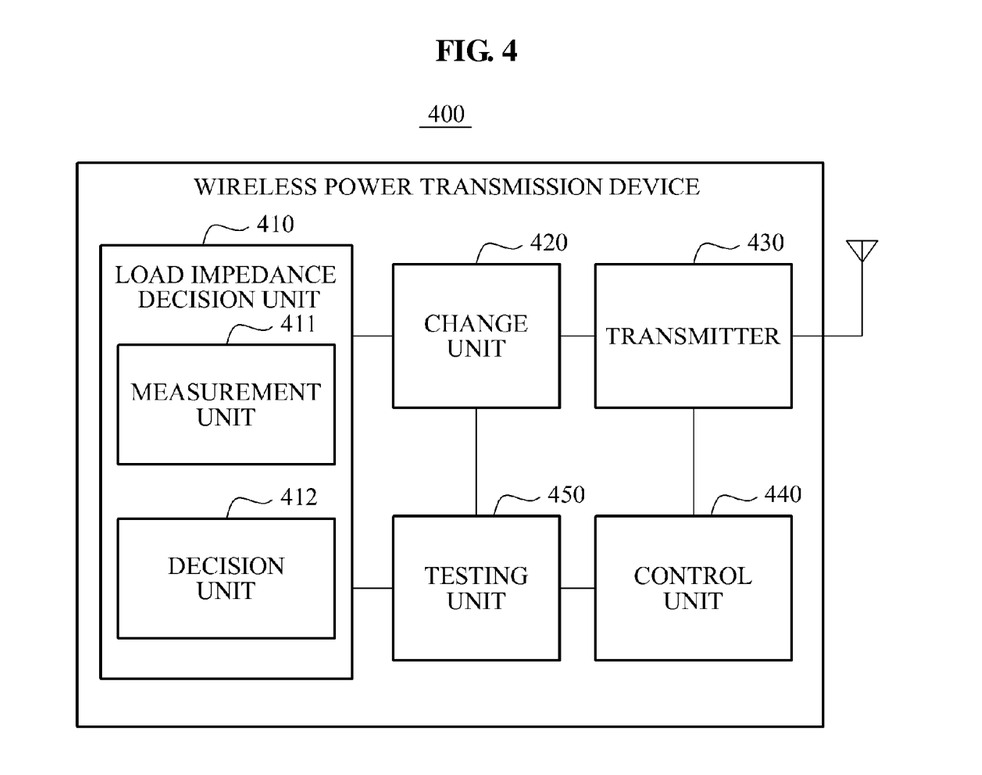
FIG. 4 is a diagram illustrating an example of a wireless power transmission device.

FIG. 4 illustrates an example of a wireless power transmission device.

Referring to FIG. 4, wireless power transmission device 400 includes a load impedance decision unit 410 and a change unit 420. The load impedance decision unit 410 includes a measurement unit 411 and a decision unit 412. The measurement unit 411 may measure at least one of a distance and an angle between a source resonator and a target resonator. The decision unit 412 may determine a load impedance based on at least one of the measured distance and angle.

Descriptions related to the load impedance decision device made with reference to FIGS. 2 and 3 may be applicable to the load impedance decision unit 410. Accordingly, further descriptions related thereto are omitted here.

The change unit 420 may change an impedance of the wireless power transmission device 400 to be conjugated with the load impedance determined by the load impedance decision unit 410, for example, the change unit 420 may change the impedance of the wireless power transmission device and combine the load impedance determined by the load impedance decision unit 410 with the impedance of the wireless power transmission device 400. For example, the change unit 420 may change the impedance of the wireless power transmission device 400 based on a tunable resistance, an inductor, a capacitor, a combination thereof, and the like.

The wireless power transmission device 400 may include a testing unit 450 and a control unit 440. The testing unit 450 may transmit a test power using the changed impedance. An amount of the test power may be predetermined, or it may be input from an outside source.

For example, when a power transfer efficiency of the test power is less than or equal to a reference value, the control unit 440 may control the load impedance decision unit 410 to re-determine the load impedance. As another example, when the power transfer efficiency of the test power is greater than or equal to the reference value, the control unit 440 may control the wireless power transmission device 400 to wirelessly transmit power using the changed impedance. For example, the reference value may be predetermined or may be input from an outside source. As another example, when the power transfer efficiency of the test power is less than the reference value, the control unit 440 may suspend a transmission of the test power.

For example, a power transfer efficiency may be determined by measuring a power of a reflected wave that reflects from the target resonator in response to receiving a transmission signal. The transmission signal corresponds to a signal to wirelessly transmit power from a source resonator to a target resonator. The reflected wave corresponds to a portion of the transmission signal that is reflected and is returned.

For example, when the power of the reflected wave is less than or equal to a reference value, this may indicate that a significant portion of the power transmitted to the target resonator was received by the target resonator. For example, when a reflected wave is less than a reference value, this may correspond to a case where the power transfer efficiency is greater than or equal to the reference value. Accordingly, the control unit 440 may control the wireless power transmission device 400 to wirelessly transmit the power using the changed impedance.

Conversely, when the power of the reflected power is greater than the reference value, this may indicate that only a small amount of power transmitted to the target resonator was received by the target resonator. For example, when a reflected wave is greater than a reference value, this may correspond to a case where the power transfer efficiency is less than the reference value. Accordingly, the control unit 440 may control the load impedance decision unit 410 to re-determine the load impedance. For example, the control unit 440 may include a power detector (not shown) to measure the power of the reflected wave, and may measure the power of the reflected wave using the power detector.

For example, the power transfer efficiency may be determined by measuring an amplitude of the reflected wave. For example, when the amplitude of the reflected wave is less than or equal to the reference value, this may indicate that only a small amount of power was reflected and a significant portion of the power was received by the target resonator. Accordingly, the control unit 440 may control the wireless power transmission device 400 to wirelessly transmit the power using the changed impedance.

Conversely, where the amplitude of the reflected power is greater than the reference value, this may indicate that a significant portion of the power was reflected and only a small amount of power was received by the target resonator. Accordingly, the control unit 440 may control the load impedance decision unit 410 to re-determine the load impedance.

The wireless power transmission device 400 may include a transmitter 430. The transmitter 430 may transmit, to a terminal (not shown), information associated with the load impedance that is determined by the load impedance decision unit 410. Because the transmitter 430 transmits information associated with the determined load impedance to the terminal, the terminal may change an impedance of the terminal to match the determined load impedance.

Figure 5:
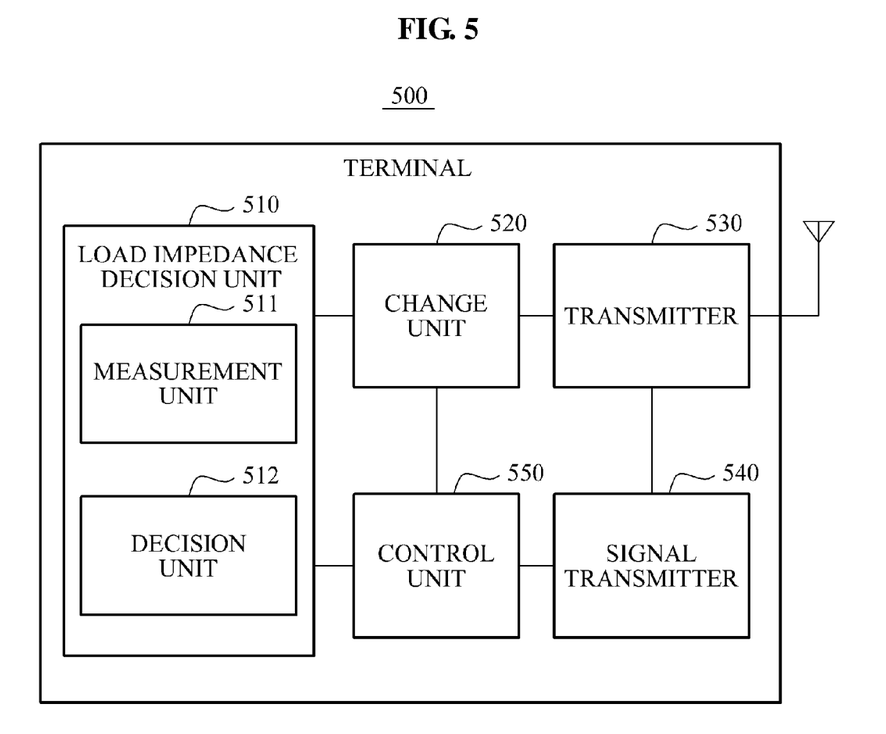
FIG. 5 is a diagram illustrating an example of a terminal that wirelessly receives power.

FIG. 5 illustrates an example of a terminal that wirelessly receives power.

Referring to FIG. 5, terminal 500 includes a load impedance decision unit 510 and a change unit 520. The load impedance decision unit 510 includes a measurement unit 511 and a decision unit 512.

The measurement unit 511 may measure at least one of a distance and an angle between a source resonator (not shown) and a target resonator (not shown). The decision unit 512 may determine a load impedance based on at least one of the measured distance and angle.

Descriptions related to the load impedance decision device made with reference to FIGS. 2 and 3 may be applicable to the load impedance decision unit 510. Accordingly, further descriptions related thereto are omitted here.

The change unit 520 may change an impedance of the terminal 500 to match the load impedance determined by the load impedance decision unit 510. For example, the change unit 520 may change the impedance of the terminal 500 based on a tunable resistance, an inductor, a capacitor, a combination thereof, and the like.

The terminal 500 may include a signal transmitter 540 and a control unit 550. When the change unit 520 changes the impedance of the terminal 500, the signal transmitter 540 may transmit a test power request signal to a wireless power transmission device (not shown). The amount of the test power may be predetermined or may be input from an outside source.

When power transfer efficiency of the test power is less than a reference value, the control unit 550 may control the load impedance decision unit 510 to re-determine the load impedance. When the power transfer efficiency of the test power is greater than or equal to the reference value, the control unit 550 may transmit a signal to a wireless power transmission device to wirelessly transmit the power. The reference value may be predetermined or may be input from an outside source. When the power transfer efficiency of the test power is less than the reference value, the control unit 550 may control the signal transmitter 540 to transmit a signal suspending the transmission of the test power.

The terminal 500 may include a transmitter 530. The transmitter 530 may transmit, to the wireless power transmission device, information associated with the load impedance determined by the load impedance decision unit 510. Because the transmitter 530 transmits information associated with the determined load impedance to the wireless power transmission device, the wireless power transmission device may change an impedance of the wireless power transmission device to be conjugated with the determined load impedance.

Figure 6:
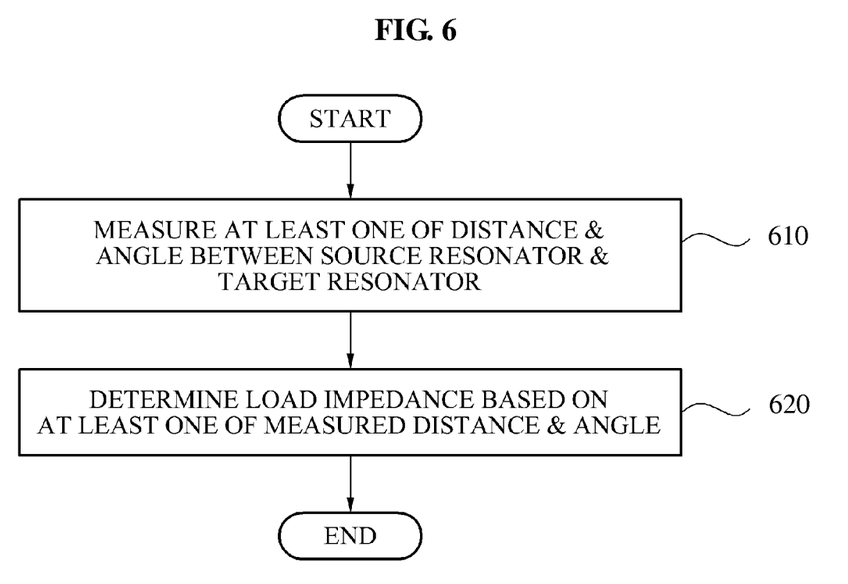
FIG. 6 is a flowchart illustrating an example of a method for determining a load impedance.

FIG. 6 illustrates an example of a method for determining a load impedance.

In 610, at least one of a distance and an angle between a source resonator and a target resonator is measured. For example, the distance between the source resonator and the target resonator may be measured by a distance sensor based on light waves and/or ultrasonic waves. The angle may indicate an angle at which the target resonator is located based on the source resonator.

In 620, a load impedance is determined based on at least one of the measured distance and angle. For example, the load impedance may be determined such that a maximum power may be transmitted from a wireless power transmission device to a terminal. A scheme for determining the load impedance is described above with reference to FIG. 3 and thus further description is omitted here.

Figure 7:
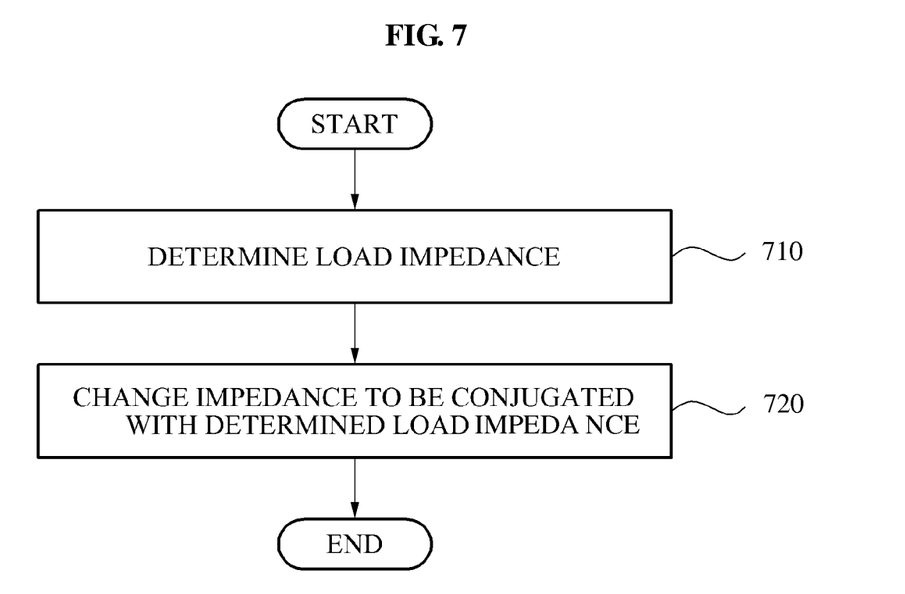
FIG. 7 is a flowchart illustrating an example of a method for wirelessly transmitting power.

FIG. 7 illustrates an example of a method for wirelessly transmitting power.

In 710, a load impedance is determined A scheme for determining the load impedance is described above with reference to FIGS. 2 and 3 and thus further description is omitted here.

In 720, an impedance is changed to be conjugated with the determined load impedance. For example, the impedance may be changed based on a tunable resistance, an inductor, a capacitor, a combination thereof, and the like.

Although not shown in FIG. 7, the wireless power transmission method may further include transmitting a test power and controlling power transmission. In this example, the test power may be transmitted using the changed impedance. An amount of test power may be predetermined or may be input from an outside source.

When a power transfer efficiency of the test power is less than a reference value, the load impedance may be controlled to be re-determined. When the power transfer efficiency of the test power is greater than or equal to the reference value, a power may be controlled to be wirelessly transmitted using the changed impedance. The reference value may be predetermined or may be input from an outside source. When the power transfer efficiency of the test power is less than the reference value, a transmission of the test power may be suspended.

For example, a power transfer efficiency may be determined by measuring a power of a reflected wave that reflects in response to the transmission signal. The transmission signal corresponds to a signal to wirelessly transmit power from a source resonator to a target resonator. The reflected wave corresponds to a portion of the transmission signal that is reflected and returned.

For example, when the power of the reflected wave is less than or equal to a reference value, this may indicate that only a small amount of power was reflected and a significant portion of the power transmitted to the target resonator was received by the target resonator. For example, it may correspond to a case where the power transfer efficiency is greater than or equal to the reference value. Accordingly, the power may be controlled to be wirelessly transmitted using the changed impedance.

Conversely, when the power of the reflected power is greater than the reference value, this may indicate that a significant portion of the power was reflected and only a small amount of power transmitted to the target resonator is received by the target resonator. For example, it may correspond to a case where the power transfer efficiency is less than the reference value. Accordingly, the load impedance may be controlled to be re-determined. For example, the wireless power transmission method may measure the power of the reflected wave using a power detector configured to measure the power of the reflected wave.

Accordingly, based on the measured power of the reflective wave, the wireless power transmission device may determine to adjust the amount of power transmitted to a wireless power receiving device. For example, the wireless power transmission device may adjust the load impedance to transfer a more efficient amount of power.

The power transfer efficiency may be determined by measuring an amplitude of the reflected wave of the transmission signal. For example, when the amplitude of the reflected wave is less than or equal to the reference value, this may indicate that only a small amount of power was reflected and this may indicate that a significant portion of the power transmitted to the target resonator was received by the target resonator. Accordingly, the power may be controlled to be wirelessly transmitted using the changed impedance.

Conversely, when the amplitude of the reflected power is greater than the reference value, this may indicate that a significant portion of the power may be reflected and only a small amount of the power transmitted to the target resonator is actually received by the target resonator. Accordingly, the load impedance may be controlled to be re-determined.

Although not shown in FIG. 7, the wireless power transmission method may further include transmitting, to a terminal, information associated with the determined load impedance. Through this, the terminal may change an impedance of the terminal to match the determined load impedance.

The processes, functions, methods, and/or software described above may be recorded, stored, or fixed in one or more computer-readable storage media that includes program instructions to be implemented by a computer to cause a processor to execute or perform the program instructions. The media may also include, alone or in combination with the program instructions, data files, data structures, and the like. Examples of computer-readable storage media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter. The described hardware devices may be configured to act as one or more software modules in order to perform the operations and methods described above, or vice versa. In addition, a computer-readable storage medium may be distributed among computer systems connected through a network and computer-readable codes or program instructions may be stored and executed in a decentralized manner.

As a non-exhaustive illustration only, the terminal device described herein may refer to mobile devices such as a cellular phone, a personal digital assistant (PDA), a digital camera, a portable game console, an MP3 player, a portable/personal multimedia player (PMP), a handheld e-book, a portable laptop personal computer (PC), a global positioning system (GPS) navigation, and devices such as a desktop PC, a high definition television (HDTV), an optical disc player, a setup box, and the like, capable of wireless communication or network communication consistent with that disclosed herein.

A computing system or a computer may include a microprocessor that is electrically connected with a bus, a user interface, and a memory controller. It may further include a flash memory device. The flash memory device may store N-bit data via the memory controller. The N-bit data is processed or will be processed by the microprocessor and N may be 1 or an integer greater than 1. Where the computing system or computer is a mobile apparatus, a battery may be additionally provided to supply operation voltage of the computing system or computer.

It should be apparent to those of ordinary skill in the art that the computing system or computer may further include an application chipset, a camera image processor (CIS), a mobile Dynamic Random Access Memory (DRAM), and the like. The memory controller and the flash memory device may constitute a solid state drive/disk (SSD) that uses a non-volatile memory to store data.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A load impedance decision device comprising:
a measurement unit to measure at least one of a distance and an angle between a source resonator and a target resonator; and
a decision unit to determine a load impedance to be used to wirelessly transmit a charging power, based on at least one of the measured distance and the measured angle.

2. The load impedance decision device of claim 1, wherein the decision unit determines the load impedance based on both the measured distance and the measured angle.

3. The load impedance decision device of claim 1, wherein the load impedance decision unit is included in the source resonator, and the measured angle corresponds to an angle with which the source resonator is tilted with respect to the target resonator.

4. A wireless power transmission device comprising:
a load impedance decision unit; and
a change unit to change an impedance of the wireless power transmission device to be conjugated with a load impedance determined by the load impedance decision unit,
wherein the load impedance decision unit comprises a measurement unit to measure at least one of a distance and an angle between the wireless power transmission device and a target resonator, and a decision unit to determine the load impedance to be used to wirelessly transmit a charging power, based on at least one of the measured distance and the measured angle.

5. The wireless power transmission device of claim 4, further comprising:
a transmitter to transmit, to a terminal, information associated with the load impedance determined by the load impedance decision unit.

6. The wireless power transmission device of claim 4, wherein the change unit changes the impedance of the wireless power transmission device based on at least one of a tunable resistance, an inductor, and a capacitor.

7. The wireless power transmission device of claim 4, further comprising:
a testing unit to transmit a test power using the changed impedance; and
a control unit to control the load impedance decision unit to re-determine the load impedance when a power transfer efficiency of the test power is less than a reference value, and to control the wireless power transmission device to wirelessly transmit a power using the changed impedance when the power transfer efficiency of the test power is greater than or equal to the reference value.

8. The wireless power transmission device of claim 4, wherein the decision unit determines the load impedance based on both the measured distance and the measured angle.

9. The wireless power transmission device of claim 4, wherein the wireless power transmission device includes a source resonator, and the measured angle corresponds to an angle with which the source resonator is tilted with respect to the target resonator.

10. The wireless power transmission device of claim 4, further comprising a source resonator configured to transmit the charging power wirelessly to the target resonator based on the changed impedance.

11. The wireless power transmission device of claim 4, wherein the load impedance is determined base on the measured distance between a source resonator of the wireless power transmission device and the target resonator.

12. The wireless power transmission device of claim 4, wherein the load impedance is determined base on the measured angle between a source resonator of the wireless power transmission device and the target resonator.

13. A terminal comprising:
a load impedance decision unit; and
a change unit to change an impedance of the terminal to match a load impedance determined by the load impedance decision unit,
wherein the load impedance decision unit comprises a measurement unit to measure at least one of a distance and an angle between the terminal and a source resonator, and a decision unit to determine the load impedance to be used to wirelessly transmit a charging power, based on at least one of the measured distance and the measured angle.

14. The terminal of claim 13, further comprising:
a transmitter to transmit, to a wireless power transmission device, information associated with the load impedance determined by the load impedance decision unit.

15. The terminal of claim 13, wherein the change unit changes the impedance of the terminal based on at least one of a tunable resistance, an inductor, and a capacitor.

16. The terminal of claim 13, further comprising:
a signal transmitter to transmit a test power request signal to a wireless power transmission device when the change unit changes the impedance of the terminal; and
a control unit to control the load impedance decision unit to re-determine the load impedance when a power transfer efficiency of the test power is less than a reference value, and to transmit a signal to the wireless power transmission device to wirelessly transmit power when the power transfer efficiency of the test power is greater than or equal to the reference value.

17. The terminal of claim 13, wherein the decision unit determines the load impedance based on both the measured distance and the measured angle.

18. The terminal of claim 13, wherein the terminal includes a source resonator, and the measured angle corresponds to an angle with which the source resonator is tilted with respect to the target resonator.

19. A method to determine a load impedance, the method comprising:
measuring at least one of a distance and an angle between a source resonator and a target resonator; and
determining a load impedance to be used to wirelessly transmit a charging power, based on at least one of the measured distance and the measured angle.

20. The method of claim 19, wherein the load impedance is determined based on both the measured distance and the measured angle.

21. The method of claim 19, wherein the measured angle corresponds to an angle with which the source resonator is tilted with respect to the target resonator.

22. A method for use in wireless power transmission, the method comprising:
determining a load impedance to be used to wirelessly transmit a charging power; and
changing an impedance to be conjugated with the determined load impedance,
wherein the determining comprises measuring at least one of a distance and an angle between the source resonator and the target resonator, and determining the load impedance to be used to wirelessly transmit a charging power, based on at least one of the measured distance and the measured angle.

* * * * *